United States Patent [19]

Crook et al.

[11] Patent Number: 5,253,068
[45] Date of Patent: Oct. 12, 1993

[54] GUN SHAPED REMOTE CONTROL UNIT FOR A TELEVISION

[76] Inventors: Michael W. Crook, 827 Union Street, Vancouver, B.C., Canada, V6A 2G5; Sheldon L. Silverman, #308-2040 York Avenue, Vancouver, B.C., Canada, V6J 1E7

[21] Appl. No.: 830,006

[22] Filed: Jan. 31, 1992

[51] Int. Cl.⁵ .............................................. H04N 5/44
[52] U.S. Cl. ........................... 358/194.1; 455/151.2; 340/825.72; 446/175; 446/406
[58] Field of Search ............................ 358/194.1, 254; 455/151.1, 151.2, 151.4; D14/218; 446/454, 175, 406; 273/310, 311, 312; 359/142, 147, 144, 148; 340/825.69, 825.72

[56] References Cited

U.S. PATENT DOCUMENTS

| | | | |
|---|---|---|---|
| D. 331,058 | 11/1992 | Morales | D14/218 |
| 4,218,138 | 8/1980 | Robertsson | 356/152 |
| 4,227,261 | 10/1980 | Robertsson | 455/600 |
| 4,365,439 | 12/1982 | Litynski | 273/310 |
| 4,566,034 | 1/1986 | Harger et al. | 358/194.1 |
| 4,578,674 | 3/1986 | Baker et al. | 340/710 |
| 4,586,715 | 5/1986 | Scolari et al. | 273/710 |
| 4,754,133 | 6/1988 | Bleich | 250/221 |
| 4,771,283 | 9/1988 | Imoto | 358/194.1 |
| 4,811,955 | 3/1989 | De Bernardini | 273/310 |
| 4,825,200 | 4/1989 | Evans et al. | 340/825.72 |
| 4,907,079 | 3/1990 | Turner et al. | 358/84 |
| 4,924,216 | 5/1990 | Leung | 340/709 |
| 4,941,036 | 7/1990 | Itoh | 358/60 |
| 4,969,208 | 11/1990 | Okazaki | 455/151 |
| 5,010,399 | 4/1991 | Goodman et al. | 358/85 |
| 5,027,202 | 6/1991 | von Hoessle et al. | 358/109 |
| 5,031,046 | 7/1991 | Brüggemann | 358/194 |
| 5,033,112 | 7/1991 | Bowling et al. | 455/603 |

OTHER PUBLICATIONS

Williams J. Hawkins; "Electronics Newsfront", pp. 16, 18 Dec. 10, 1987.

Primary Examiner—James J. Groody
Assistant Examiner—Jeffrey S. Murrell
Attorney, Agent, or Firm—Townsend and Townsend Khourie and Crew

[57] ABSTRACT

A universal remote control unit for changing television channels is shaped like a gun to allow a viewer to point the gun at a television set, and shoot the channel to change the program. The unit is gun shaped having a barrel with a muzzle end containing an infrared beam emitter to produce a signal beam to engage an infrared beam receiver of a television set and provide channel selection. A hand grip portion has a trigger which operates a channel selection switch to produce a signal beam from the infrared emitter to change the channel. A channel direction switch selects whether the channel change should be up or down, and a power source is provided for powering the controls and the light beam emitter. In another embodiment a light beam emitter and a sound effect emitter are included in the gun.

9 Claims, 3 Drawing Sheets

GUN SHAPED REMOTE CONTROL UNIT FOR A TELEVISION

TECHNICAL FIELD

The present invention relates to a remote control device for operation of a television. More specifically the present invention provides a universal remote control unit which is gun shaped and is operated like a gun to eliminate a viewed program by changing channels on a television set.

BACKGROUND ART

Remote control units for televisions are used to control all operations of a television and a VCR. The units are made so that they are universal and can be programmed for the majority of televisions available on the market today. The operation is by sending an infrared signal from the control unit to an infrared receiver on the television or VCR. Remote control are used to change channels, volume control, on/off control and many other features that different televisions are equipped with today.

It is known to provide a gun shaped control device for playing television games. In some cases the device projects a beam of light to locate a spot on a television, in other cases the unit produces an infrared signal similar to that used by a remote control for a television but the signal cooperates with specific hardware positioned adjacent to the television.

DISCLOSURE OF INVENTION

It is an object of the present invention to provide a gun shaped remote control unit that allows a television watcher to point the gun at the television and pull the trigger so that the channel changes to a higher or lower channel. Thus the present invention does not provide a game, but a remote control unit which operates a television. By pointing the gun at the television, one is able to better direct an infrared beam to engage an infrared beam receiver on a television set. The unit also has the feature of allowing a television watcher to "shoot" the television set in order to change the program being watched.

In other features of the invention the remote control unit may be fitted with a light beam which directs a beam of light onto the television screen and also have sound effects which are activated by pulling the trigger.

The present invention provides a remote control unit for operating television channel selection in association with a television set having an infrared beam receiver means comprising: simulated hand gun having a barrel shaped portion with a muzzle end and a hand grip portion with a trigger means, infrared beam emitter means located at the muzzle end for producing a signal beam to engage the infrared beam receiver of the television set and provide channel selection, channel selection switch in the unit connected to the trigger means, such that depression of the trigger means produces the signal beam from the infrared beam emitter means to change a television channel, channel direction switch means in the unit connected with the channel selection switch to select between the signal beam changing the television channel up and changing the television channel down, and power source in the unit for control means to produce the signal beam.

BRIEF DESCRIPTION OF DRAWINGS

In drawings which illustrate embodiments of the present invention.

BEST MODE FOR CARRYING OUT THE INVENTION

Figure 1:
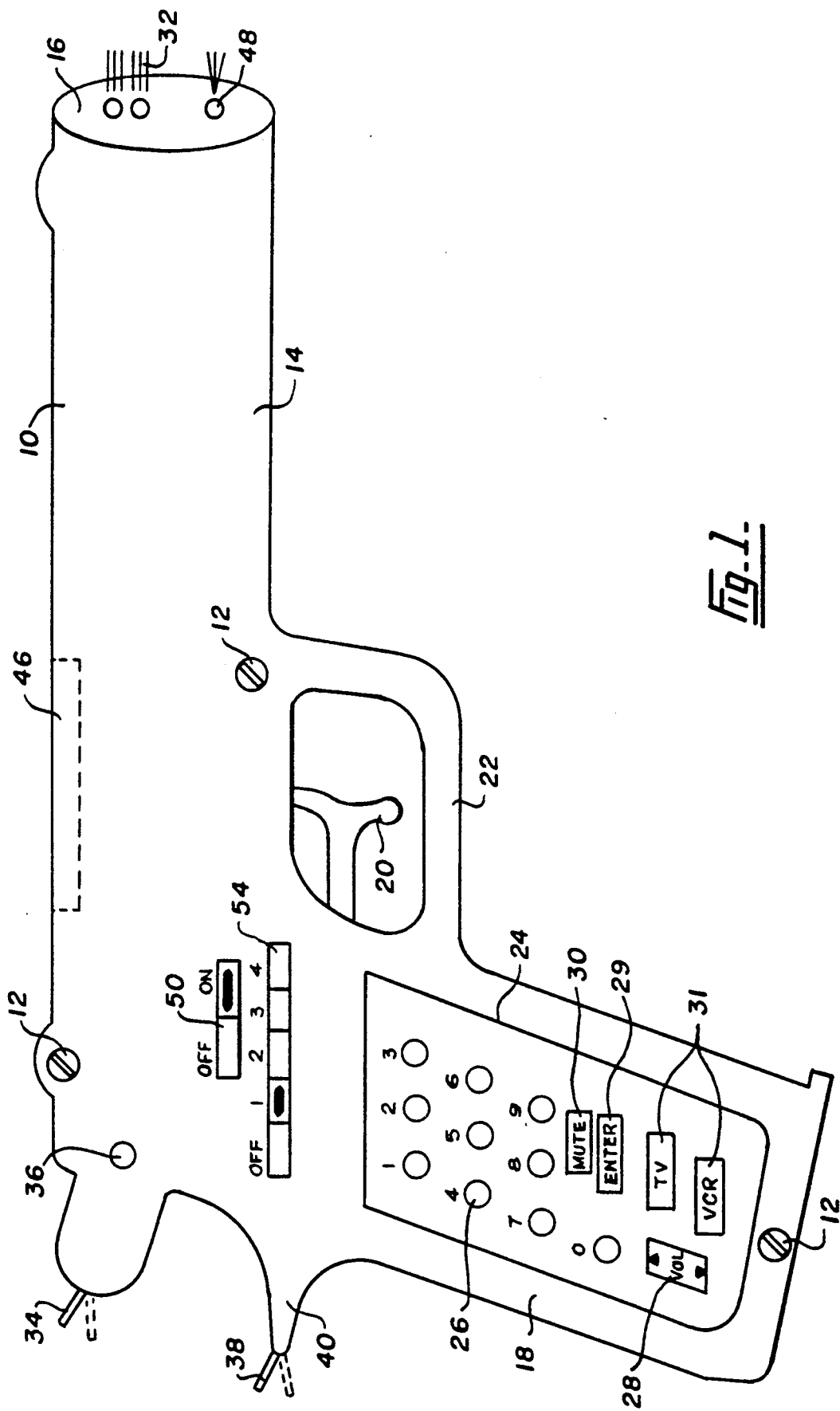
FIG. 1 is an external view showing a gun shaped remote control unit according to one embodiment of the present invention.

FIG. 1 shows one embodiment of a gun shaped remote control unit shaped like a automatic pistol. The unit is made in two halves with casing 10 that are held together by means of screws 12. The unit has a barrel shaped portion 14 extending to a muzzle end 16 and a hand shaped portion 18 extending down and having a trigger 20 inside a trigger guard 22. On one side of the hand grip 18 is a control pad 24 with numerous push buttons 26 numbered one to zero for selecting a three digit code for adapting the universal remote control unit to a specific television set. Most television sets today can be operated by a universal remote control unit after the unit is programmed to match the infrared beam receiver. In some units, the push buttons 26 are then used for channel selections. A volume control two way switch 28, selection switches for TV and VCR 31, a mute button 30, and an enter push button 29 for entering the three digit code or entering a channel number are also shown on the control pad 24. The control pad 24 is shown on the right hand side of the hand grip 18, but is preferred to be on the left hand side when the gun is held in a person's right hand s it is easily visible.

The muzzle end 16 of the barrel 10 has two infrared emitters 32 which are adapted to cooperate with an infrared beam receiver (not shown) on a television set. An on/off switch 34 is located where the hammer of a real pistol would be. This is a momentary switch used to turn the TV or VCR on or off and light in the form of a red visible LED 36 is mounted on the side of the gun to indicate when an infrared signal beam is being transmitted from one or both of the infrared emitters 32.

A channel direction switch 38 is provided on a protrusion 40 beneath the on/off switch 34. The channel direction switch 38 has two positions to control whether the channel change is channel up or channel down when the trigger 20 is depressed.

Figure 2:
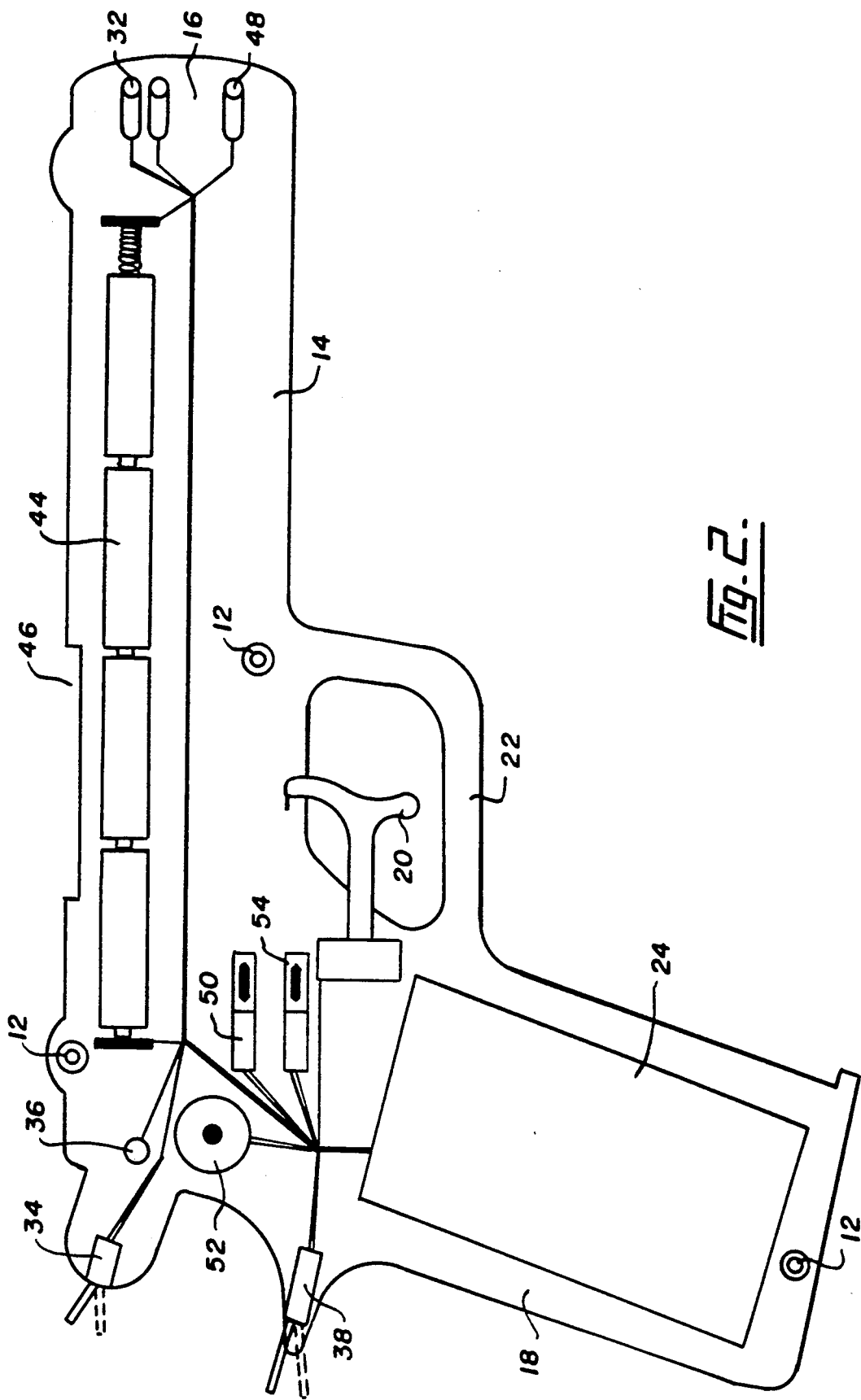
FIG. 2 is an internal view showing the gun shaped remote control unit shown in FIG. 1.

The inside of the gun shaped unit is shown in FIG. 2. The trigger 20 is connected to a channel select switch 42 so that when the trigger is depressed, the channel select switch 42 produces a signal which through a central processing unit is changed to an infrared signal beam from the emitters 32 to either change the channel number upwards or downwards depending upon the position of the channel direction switch 38. Four batteries 44 are shown positioned in the barrel position 14. The batteries 44 are inserted through an entry slot 46 in a manner somewhat similarly to bullets in a gun. A cover is provided over the entry slot 46.

Two other separate features are provided with the gun shaped unit. A light beam emitter 48 is located at the muzzle end 16 adjacent the infrared emitters 32. The light emitter 48 has a light beam slide switch 50 adjacent the trigger 20. When this is in the on position, and the trigger 20 is depressed, not only is an infrared signal beam transmitted from the infrared emitters 32 but also a light beam is transmitted from the light emitter 48. Similarly a small speaker 52 or other noise emitter is positioned in the gun body and a sound effect slide switch 54 is provided just beneath the light beam slide switch 50. When the trigger 20 is depressed a special sound effect occurs simulating the noise of a gun or simulating another noise. Different sound effects may be provided from sound effect hardware and may be programmed into the gun to suit particular requirements of the user.

In one embodiment, the sound effect slide switch 54 has a number of positions as shown by lines under the switch in FIG. 1. The switch may be set in any one of these positions which produces a different sound effect, i.e., machine gun, electronic sound and other sound effects that are appropriate. Thus a choice of sounds is provided for the operator.

In another embodiment, the channel select switch 42 has two positions, a first position where the trigger 20 is moved a first amount. In this first position the light beam is transmitted from the light emitter 40 and/or the sound effect occurs from the speaker 52. The trigger 20 is then pulled further, so the channel select switch 42 moves to a second position which activates the infrared emitters 32 to produce an infrared beam to change the channel.

Figure 3:
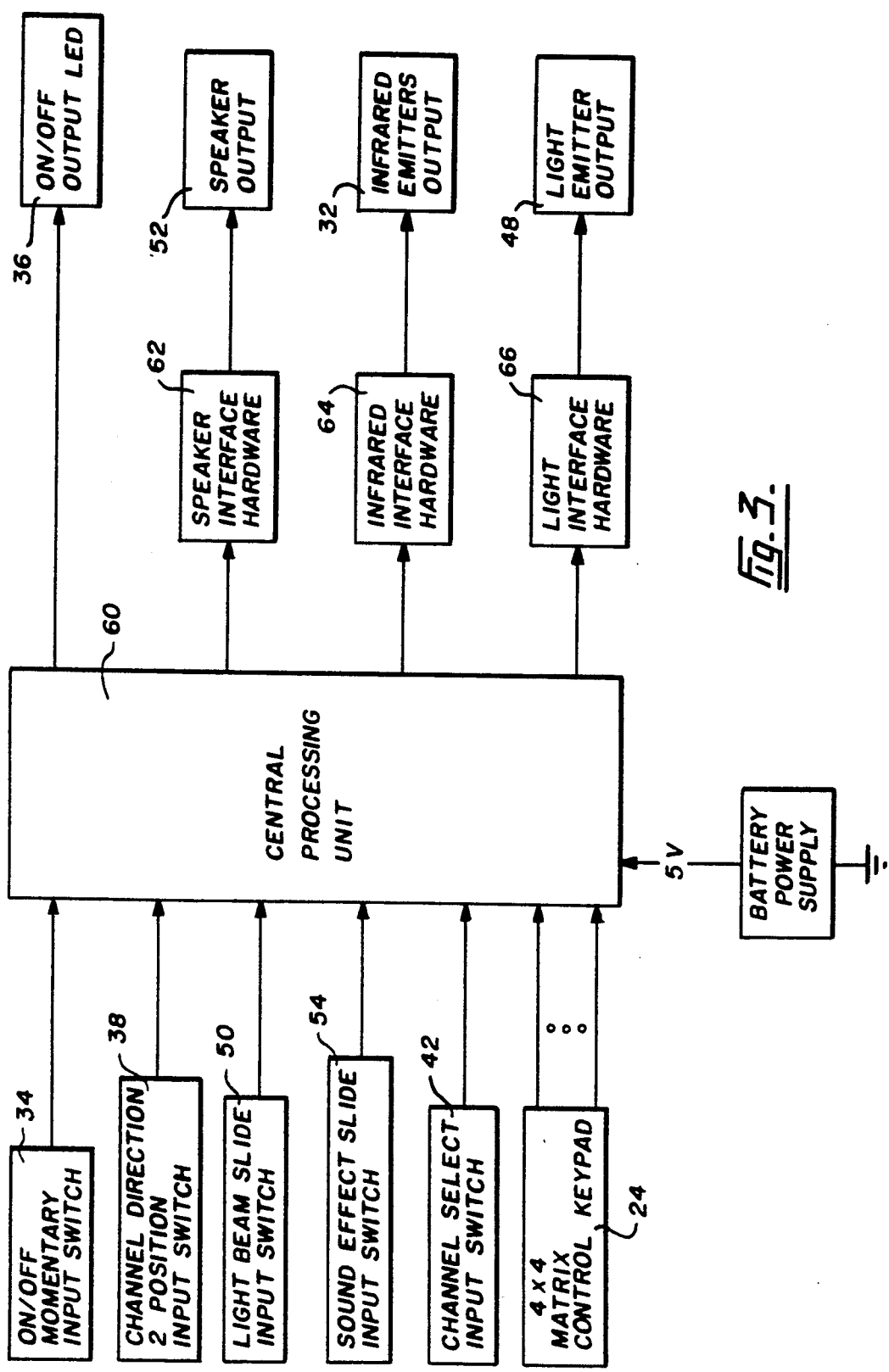
FIG. 3 is a block diagram showing one embodiment of a control system for the remote control unit of the present invention.

The block diagram in FIG. 3 shows a central processing unit 60 which in the preferred embodiment is in the form of a small chip through which all switches are shown on the left and all outputs are shown on the right. The battery power supply 44 provides power to the central processing unit 60. Speaker interface hardware 62 is shown to the speaker output 52 infrared interface hardware 64 is shown to the infrared emitters 32 and light interface hardware 66 to the light emitter 48.

In operation the on/off switch is operated by the thumb of the gun holder as is the channel direction switch 38. The up and down changing of channels is achieved by pulling the trigger 20 to activate the channel select switch 42. Push buttons on the control key pad 24 operate the other television and VCR functions. The channel direction switch 38 has two positions. In the up position, the channel select switch 42 changes the channel upwards and in the down position, the channel select switch 42 changes the channel downwards. The infrared signal beam from the infrared emitters 32 either to a VCR or to a television is emitted when the trigger 20 is depressed to activate the channel select switch 42, or by operation of the control pad 24.

The channel select switch 42 operated by the trigger 20 can also operate the light beam from light emitter 48. By sliding the light beam switch 50 into one of the on positions, a light beam is projected when the trigger 20 is depressed. The light beam can be directed at a specific target on the television screen. Similarly a sound effect occurs when the sound effect slide switch 54 is in the on position. The sound effect is produced from the speaker 52 and the acoustic hardware 62 and may be the sound of a gun or other sounds as desired. Thus pressing the trigger 20 produces a flash of light from the light emitter 48 and the sound of a gun from the speaker 52.

The on/off momentary switch 34 is used to turn the television on or off as desired and is located at the position where one would depress the hammer of a revolver or pistol. The LED light 36, preferably red, indicates when an infrared signal beam is being transmitted from the infrared emitters 32.

The batteries 44 are replaced when necessary by placing them through the lid 46 of the battery compartment in a similar manner as one would load bullets into a gun.

In operation the gun can be used either left hand or right hand aimed at the television screen by a user thus a user may point the gun at a person or an object visible on the television screen and pull the trigger which will produce a beam of light to shine on the screen, a noise from the sound system, and at the same time change the channel either up or down depending upon the position of the channel direction switch 38. If one wishes to return to the previous channel, then it is merely necessary to change the direction of the channel direction switch 38 press the trigger again and the previous channel is returned.

Whereas the drawings illustrate a gun shaped like an automatic pistol it will be apparent that the shape of the gun may be changed. A revolver, automatic, a gun, a rifle, or other shapes of guns that have a barrel shape and a trigger mechanism may be provided. The gun has a means of being gripped in the hand and the barrel or equivalent is provided with infrared emitters 32 positioned at the muzzle or end of the gun shaped device so that an infrared beam can be pointed at the screen.

The materials o construction for the casing 14 may be plastic or light weight metal as desired.

Various changes may be made to the embodiments shown herein without departing from the scope of the present invention which is limited only by the following claims.

We claim:

1. Remote control unit for operating television channel selection in association with a television set having an infrared beam receiver means comprising:
   simulated hand gun having a barrel shaped portion with a muzzle end and a hand grip portion with a trigger means;
   infrared beam emitter means located at the muzzle end for producing a signal beam to engage the infrared beam receiver of the television set and provide channel selection;
   channel selection switch in the remote control unit connected to the trigger means, such that depression of the trigger means produces the signal beam from the infrared beam emitter means to change a television channel;
   channel direction switch on the remote control unit associated with the channel selection switch to select between the signal beam changing the television channel up and changing the television channel down,
   sound effect means on the remote control unit, the sound effect means activated by depression of the trigger means, and
   power source in the remote control unit to produce the signal beam, and power the sound effect means.

2. The remote control unit according to claim 1 including a keypad for providing push button controls for variations in the signal beam for different commands to the television set.

3. The remote control unit according to claim 1 including momentary switch for producing a signal beam to turn the television set on and off.

4. The remote control unit according to claim 1 including a light beam emitter located at the muzzle end adjacent the infrared beam emitter means to produce a light beam upon depression of the trigger means.

5. The remote control unit according to claim 4 including switch means to disengage the light beam emitter.

6. The remote control unit according to claim 4 wherein the channel selection witch has two positions, a first position when the trigger means is moved a first amount, to produce a light beam, and a second position when the trigger means is moved a full amount to produce a signal beam.

7. The remote control unit according to claim 1 including a visible light activated on depression of the trigger means.

8. The remote control unit according to claim 1 wherein the channel selection switch has two positions, a first position when the trigger means is moved a first amount to activate the sound effect means, and a second position when the trigger means is moved a full amount to produce a signal beam.

9. The remote control unit according to claim 1 wherein the sound effect means produces a plurality of different sound effects, and including a sound selector switch means to select one of the different sound effects and to turn off the sound effect means.

* * * * *